(12) United States Patent
You (10) Patent No.: US 8,757,833 B2
(45) Date of Patent: Jun. 24, 2014

(54) LIGHT EMITTING DEVICE PACKAGE

(75) Inventor: Jae Sung You, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 126 days.

(21) Appl. No.: 13/411,094

(22) Filed: Mar. 2, 2012

(65) Prior Publication Data

US 2012/0243223 A1    Sep. 27, 2012

(30) Foreign Application Priority Data

Mar. 24, 2011    (KR) ........................ 10-2011-0026289

(51) Int. Cl.
*F21V 1/00*    (2006.01)

(52) U.S. Cl.
USPC ........................................... 362/235

(58) Field of Classification Search
USPC ........................................... 362/235
See application file for complete search history.

(56) References Cited

U.S. PATENT DOCUMENTS

| | | | |
|---|---|---|---|
| 2005/0221518 A1* | 10/2005 | Andrews et al. | 438/27 |
| 2006/0022216 A1* | 2/2006 | Chikugawa | 257/99 |
| 2006/0278882 A1 | 12/2006 | Leung et al. | |
| 2007/0001187 A1 | 1/2007 | Kim | |
| 2007/0145398 A1 | 6/2007 | Shin | |
| 2008/0210964 A1 | 9/2008 | Tomioka | |

FOREIGN PATENT DOCUMENTS

| | | |
|---|---|---|
| CN | 1893130 A | 1/2007 |
| CN | 101150164 A | 3/2008 |
| JP | 2009-070870 | 4/2009 |
| JP | 2010-093066 | 4/2010 |
| KR | 10-2003-0053853 A | 7/2003 |
| KR | 10-2010-0108971 A | 10/2010 |

OTHER PUBLICATIONS

Chinese Office Action issued in Chinese Patent Application No. CN 201210080682.2 dated Apr. 8, 2014.

* cited by examiner

*Primary Examiner* — Evan Dzierzynski
(74) *Attorney, Agent, or Firm* — McDermott Will & Emery LLP (57) ABSTRACT

There is provided a light emitting device package, including at least one light emitting device; a lead frame electrically connected to the light emitting device; a body part supporting the light emitting device and the lead frame and including a cavity opened so as to expose the light emitting device and the lead frame; a reflecting part fitted and fixed into the cavity so as to surround the light emitting device; and a sealing part filled in the reflecting part and sealing the light emitting device.

15 Claims, 10 Drawing Sheets

LIGHT EMITTING DEVICE PACKAGE

CROSS-REFERENCE TO RELATED APPLICATIONS

This application claims the priority of Korean Patent Application No. 10-2011-0026289 filed on Mar. 24, 2011, in the Korean Intellectual Property Office, the disclosure of which is incorporated herein by reference.

BACKGROUND OF THE INVENTION

1. Field of the Invention

The present invention relates to a light emitting device package.

2. Description of the Related Art

Recently, a light emitting device package formed of a light emitting diode (LED) allowing for the emission of light according to an electrical signal has been widely used as a light emitting source in a variety of electronic products, as well as in mobile communications terminals, such as a personal mobile phone, a personal digital assistant (PDA), and the like.

The light emitting diode is a kind of light emitting device capable of emitting light of various colors through the alternation of a compound semiconductor material, such as gallium arsenide (GaAs), aluminum gallium arsenide (AlGaAs), Gallium nitride (GaN), InGaInP, or the like.

In implementing a package structure including a light emitting device therein according to the related art, a package structure in which a cup-shaped cavity is formed in a package body made of a highly reflective material so as to reduce the loss of light emitted from the light emitting device and then the cavity is filled with a silicon resin after installing a light emitting device chip within the cavity, has been generally used.

However, since the package body may be generally made of a resin material, such as phenylpropanolamine (PPA) or a liquid crystal polymer (LCP), a deterioration phenomenon may be caused by high temperature heat generated from the light emitting device in long-term use of a package, and accordingly, the discoloration of the resin material may caused by changes in properties of the PPA or LCP material to thereby lead to a reduction in luminous flux.

SUMMARY OF THE INVENTION

An aspect of the present invention provides a light emitting device package having a simple structure and capable of preventing discoloration caused by a deterioration phenomenon at the surface of a cavity having a cup structure formed in a package body to thereby prevent a reduction in luminous flux.

According to an aspect of the present invention, there is provided a light emitting device package, including: at least one light emitting device; a lead frame electrically connected to the light emitting device; a body part supporting the light emitting device and the lead frame and including a cavity opened so as to expose the light emitting device and the lead frame; a reflecting part fitted and fixed into the cavity so as to surround the light emitting device; and a sealing part filled in the reflecting part and sealing the light emitting device.

The body part may include a seating part formed to be protruded inwardly from an inner circumferential surface of the cavity and to partially cover the lead frame exposed through the cavity, and having the reflecting part disposed on an upper surface thereof.

The seating part may have a ring shape formed along the inner circumferential surface of the cavity.

The seating part may include a plurality of seating parts, and the plurality of seating parts may be formed along the inner circumferential surface of the cavity while being spaced apart from one another.

The reflecting part may have a reflecting surface having a tapered shape in which an inner circumferential surface of the reflecting part is inclined.

The reflecting part may include a fixing part formed to be protruded from an outer circumferential surface thereof and caught and fixed to an inner circumferential surface of the cavity.

The fixing part may have a snap fit shape.

The fixing part may be formed in at least one of upper and lower portions of the reflecting part, or formed in both of the upper and lower portions of the reflecting part.

The fixing part may have a ring shape formed along the outer circumferential surface of the reflecting part.

The fixing part may include a plurality of fixing parts, and the plurality of fixing parts may be formed along the outer circumferential surface of the reflecting part while being spaced apart from one another.

Between the outer circumferential surface of the reflecting part and the inner circumferential surface of the cavity, an accommodating space formed by the fixing part may be provided.

The reflecting part may include a groove formed to be recessed along an outer circumferential surface thereof.

The reflecting part may include a recess part having a stepped structure in a top portion thereof.

The reflecting part may be formed to have a circular, a quadrangular, or a polygonal ring shape.

The light emitting device package may further include a lens part provided on the body part and covering the sealing part.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and sizes of components are exaggerated for clarity. The same or equivalent elements are referred to by the same reference numerals throughout the specification.

A light emitting device package according to embodiments of the present invention will be explained with reference to FIGS. 1 through 10.

Figure 1:
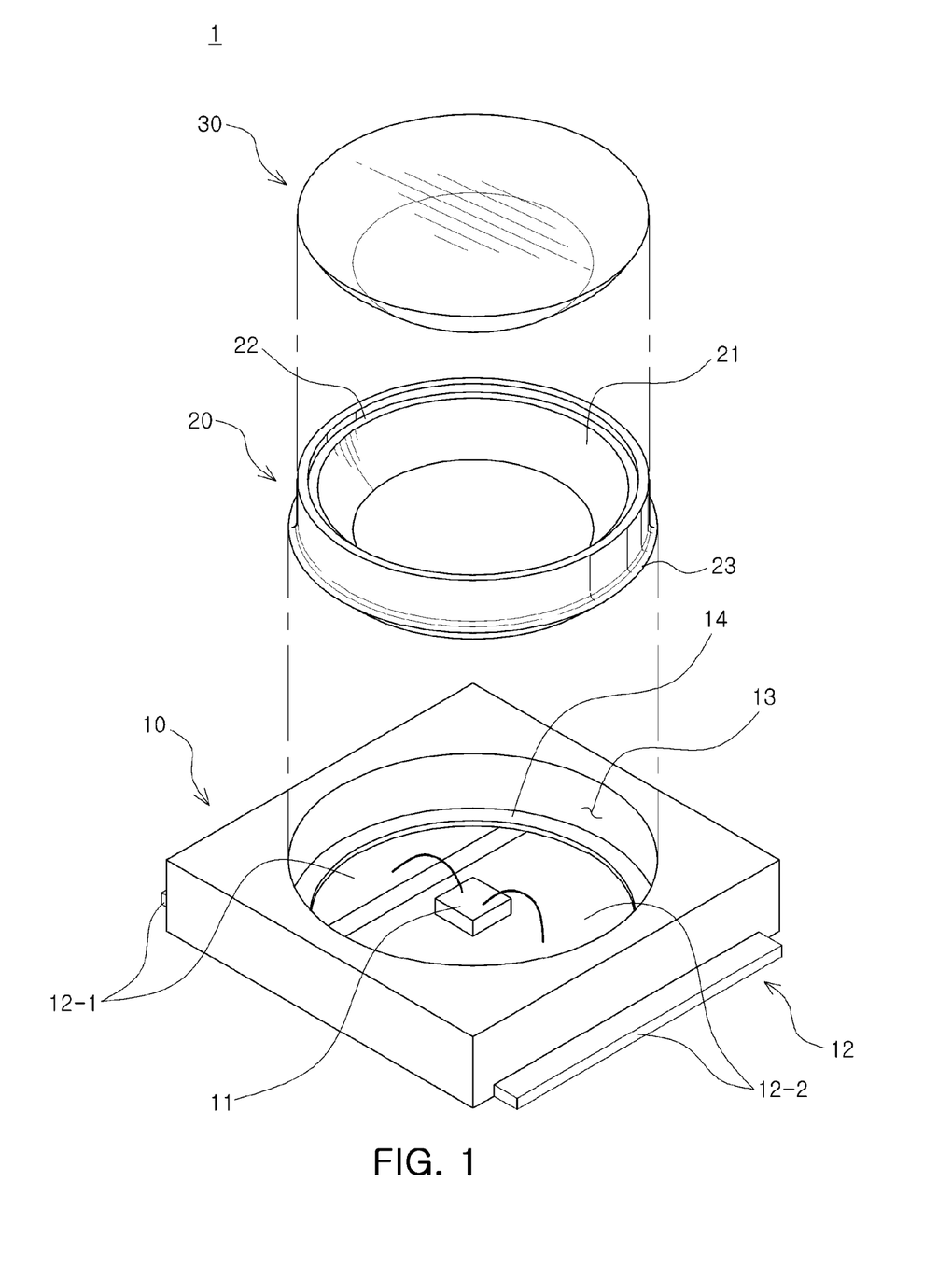
FIG. 1 is a schematic perspective view of a light emitting device package according to an embodiment of the present invention.
Figure 2:
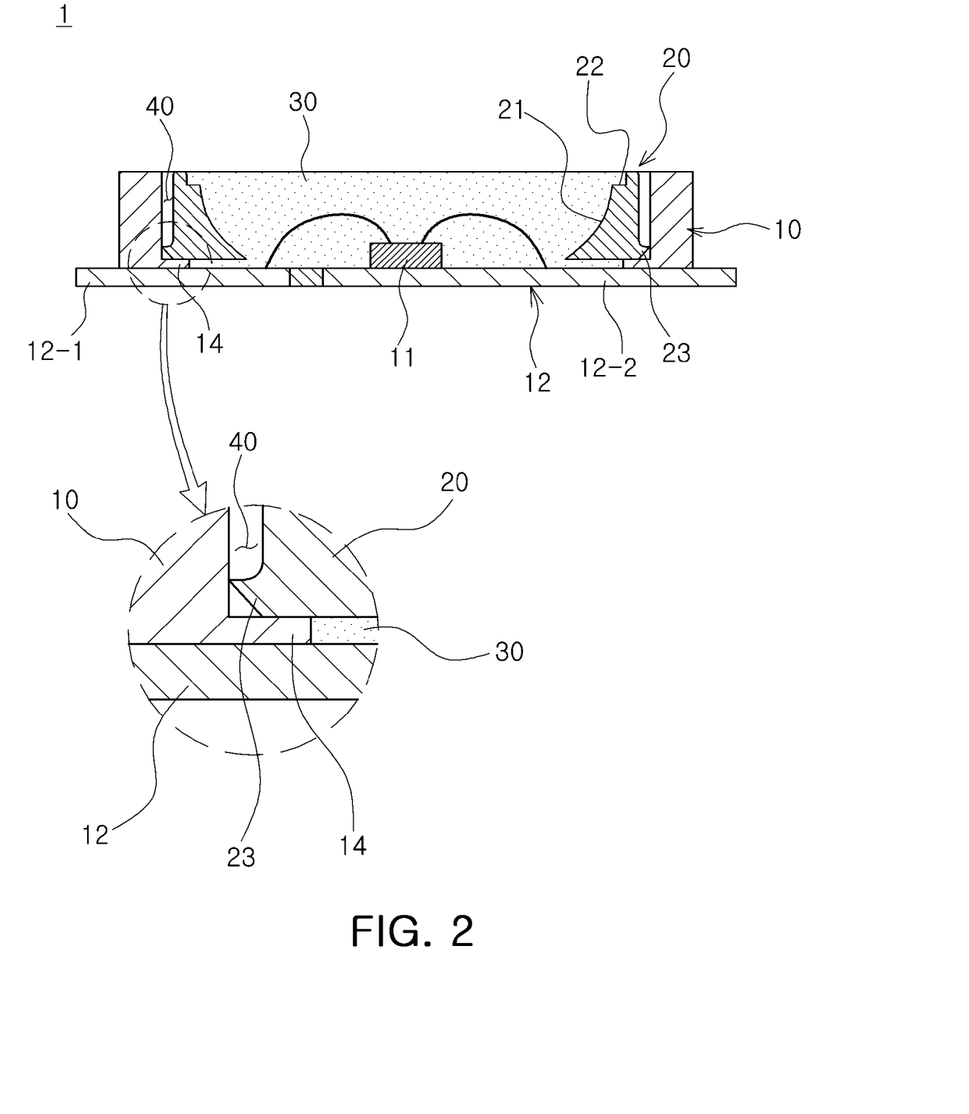
FIG. 2 is schematic cross-sectional view of the light emitting device package of FIG. 1.
Figure 3A:
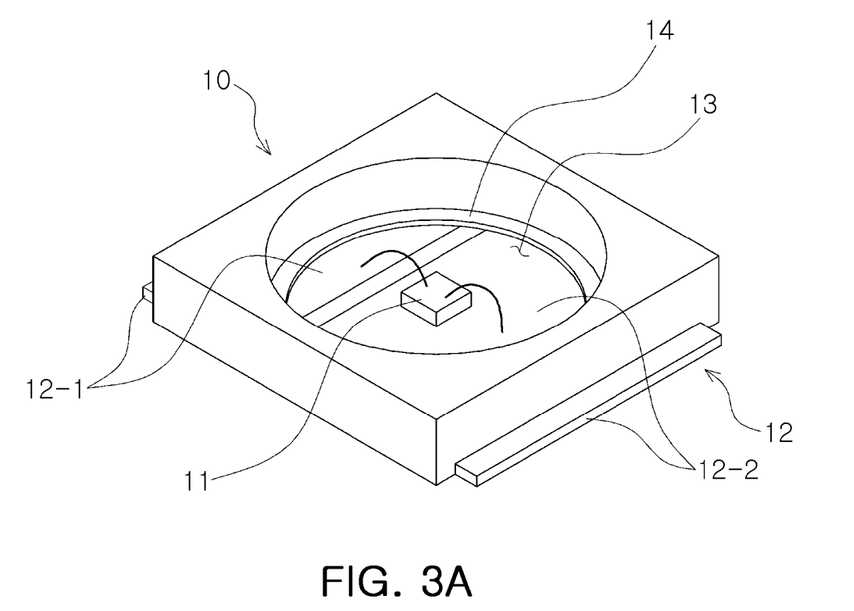
FIG. 3A is a schematic view of a body part and a seating part in the light emitting device package of FIG. 1.
Figure 3B:
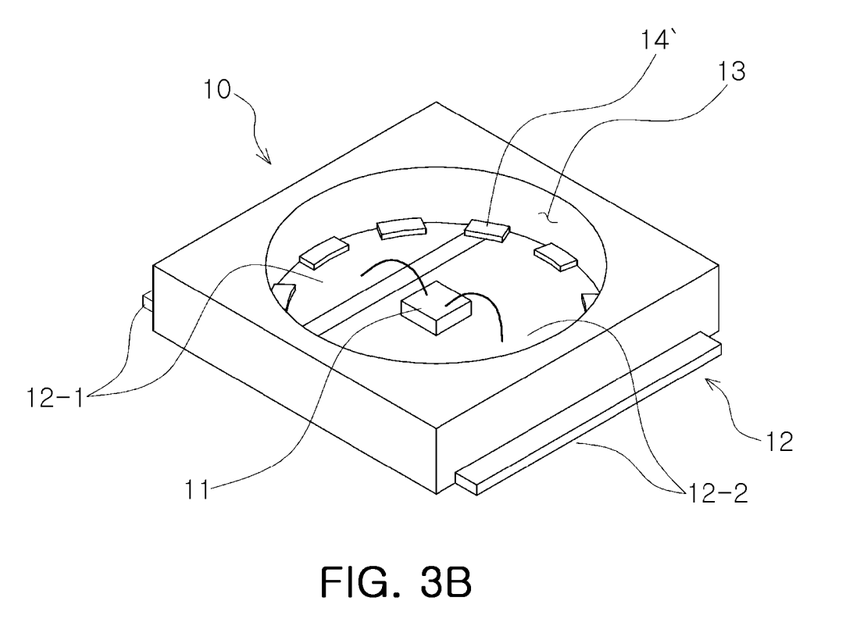
FIG. 3B is a schematic view showing another embodiment of the seating part shown in FIG. 3A.

FIG. 1 is a schematic perspective view of a light emitting device package according to an embodiment of the present invention. FIG. 2 is schematic cross-sectional view of the light emitting device package of FIG. 1. FIG. 3A is a schematic view of a body part and a seating part in the light emitting device package of FIG. 1. FIG. 3B is a schematic view showing another embodiment of the seating part shown in FIG. 3A.

Referring to FIG. 1, a light emitting device package 1 according to an embodiment of the present invention may include at least one light emitting device 11, a lead frame 12 electrically connected to the light emitting device 11, a body part 10 including a cavity 13 opened so as to expose the light emitting device 11 and the lead frame 12, a reflecting part 20 fitted and fixed into the cavity 13 so as to surround the light emitting device 11, and a sealing part 30 filled in the reflecting part 20 and sealing the light emitting device 11.

The light emitting device 11 may include a light emitting diode, a semiconductor device emitting light having a predetermined wavelength through the application of external power, and may be provided singularly, as shown in the drawings, or provided in plural.

The lead frame 12 may include first and second lead frames 12-1 and 12-2, that is, a plurality of lead frames, and the first and second lead frames 12-1 and 12-2 may be disposed to be spaced apart so as to be electrically isolated from each other. A side of the lead frame 12, for example, the second lead frame 12-2 may have the light emitting device 11 mounted thereon and may be electrically connected to the first lead frame 12-1 through a bonding wire. Although not illustrated, the second lead frame 12-2 may also be connected to the first lead frame 12-1 by a flip chip bonding method through the use of solder or the like.

As shown in FIGS. 1 through 3, the lead frame 12 may be exposed to the outside through a lower portion of the body part 10. Accordingly, heat generated from the light emitting device 11 mounted on the lead frame 12 may be emitted directly to the outside through the lead frame 12.

The body part 10 is formed to surround the lead frame 12 and may support and fix the lead frame 12 thereto. The body part 10 may be formed by molding an opaque or a highly reflective resin, and may be made of a polymer resin which may be easily used in an injection process. However, present invention is not limited thereto; the body part 10 may be formed by molding various resin materials, or made of a nonconductive material, such as ceramics.

The body part 10 may include the open cavity 13 in an upper surface thereof to thereby expose the light emitting device 11 and the lead frame 12. As shown in FIGS. 1 through 3, the cavity 13 is generally formed to have a round shape. However, the shape of the cavity 13 is not limited thereto and may be variously formed to have, for example, a quadrangular shape or the like.

The body part 10 may include a seating part 14 formed to be protruded inwardly from an inner circumferential surface of a lower portion of the cavity 13 and to partially cover the lead frame 12 exposed through the cavity 13. As shown in FIGS. 1 through 3, the seating part 14 may be formed to be protruded inwardly from the inner circumferential surface of the cavity 13 and to be stepped with the lead frame 12 disposed on a lower portion thereof. On the seating part 14, a reflecting part 20, to be described later, may be disposed.

As shown in FIG. 3A, the seating part 14 may have a ring shape continuously formed along the inner circumferential surface of the cavity 13. The seating part 14 may be provided in plural. In addition, as shown in FIG. 3B, a plurality of seating parts 14' may be formed along the inner circumferential surface of the cavity 13 in such a manner as to be spaced apart from one another by a predetermined distance. In this case, spaces between the spaced seating parts 14' may be filled with a sealing part 30, to be described later, whereby coupling force between the sealing part 30 and the body part 10 may be improved.

The seating parts 14 and 14' may be made of a nonconductive material like the body part 10 and integrally formed with the body part 10. The seating parts 14 and 14' may also be made of an insulating material. Furthermore, the seating parts 14 and 14' may be formed independently from the body part 10 and included within the body part 10 in such a manner as to be inserted into the inner circumferential surface of the cavity 13 to thereby come into contact with the lead frame 12.

These seating parts 14 and 14' may prevent the reflecting part 20, to be described later, from coming into contact with the lead frame 12 to be electrically connected therewith, the reflecting part 20 being made of a metallic material. Concretely, when the reflecting part 20 is inserted into the cavity 13 and coupled thereto, the reflecting part 20 may be disposed on the seating parts 14 and 14', whereby the reflecting part 20 and the lead frame 12 may be electrically isolated from each other through the seating parts 14 and 14' disposed between the reflecting part 20 and the lead frame 12.

The reflecting part 20 may act as a reflective cup reflecting light emitted from the light emitting device 11 to allow for improvements in luminous efficiency and may be fitted and fixed into the cavity 13 so as to surround the light emitting device 11 mounted within the cavity 13. The reflecting part 20 will be described in detail with reference to FIGS. 4 through 8.

Figure 4:
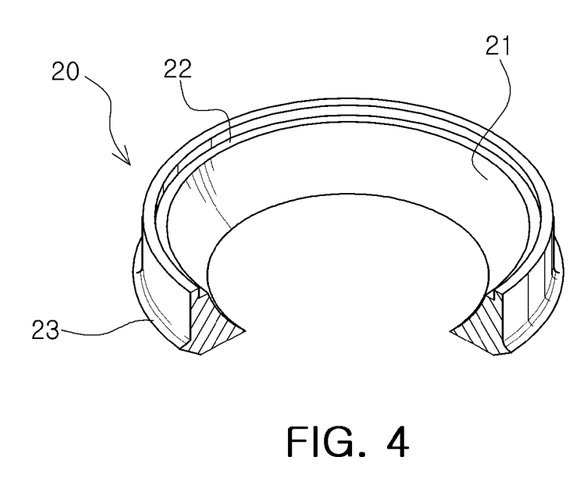
FIG. 4 is a schematic view of a reflecting part in the light emitting device package of FIG. 1.
Figure 5A:
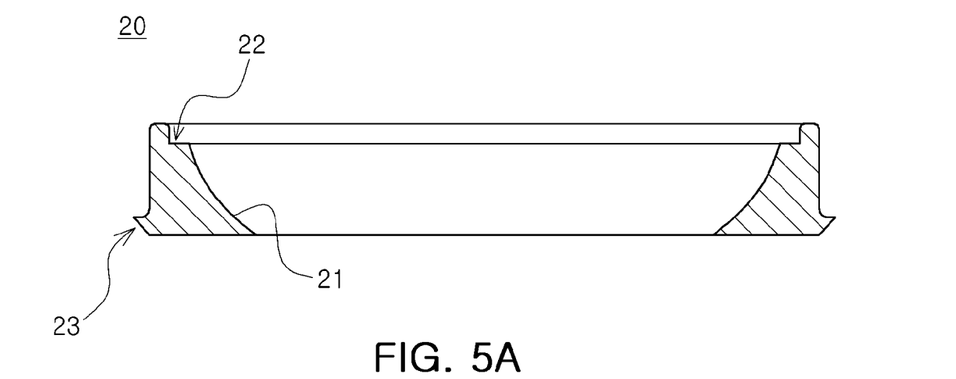
FIGS. 5A and 5B are schematic cross-sectional views of the reflecting part shown in FIG. 4.
Figure 5B:
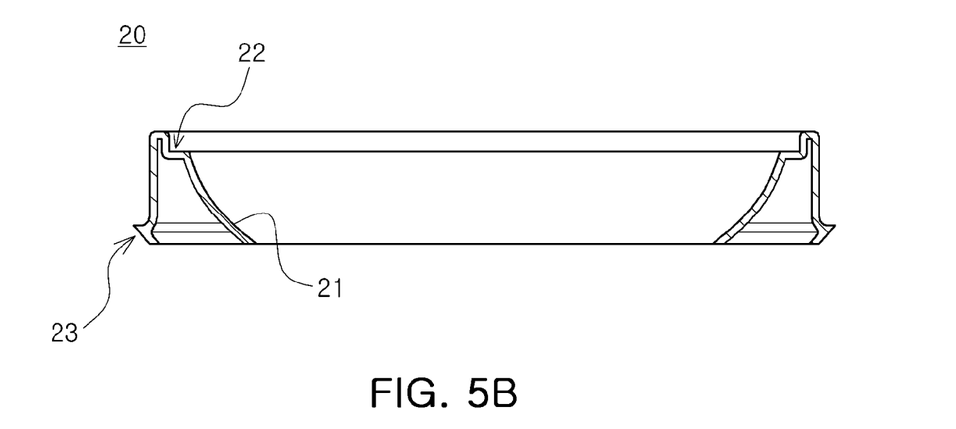
Figure 6A:
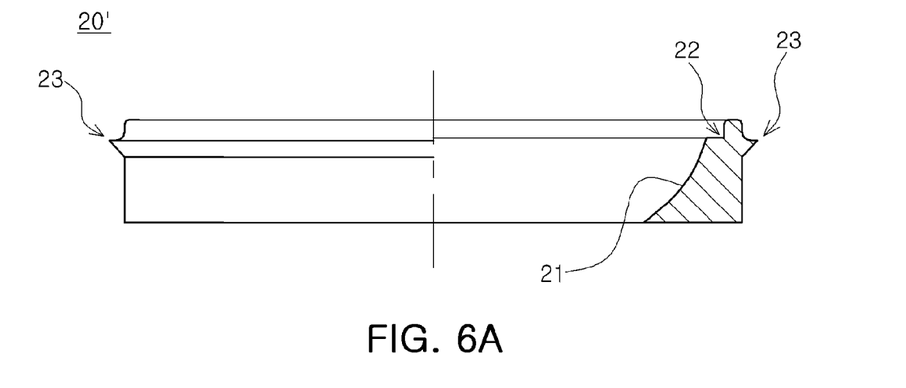
FIGS. 6A and 6B are schematic cross-sectional views, respectively showing another embodiment of the reflecting part shown in FIG. 4 and FIGS. 5A and 5B.
Figure 6B:
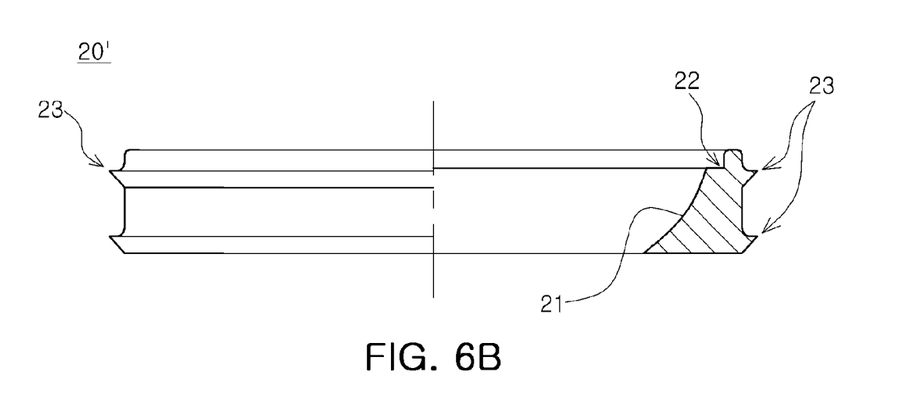
Figure 7A:
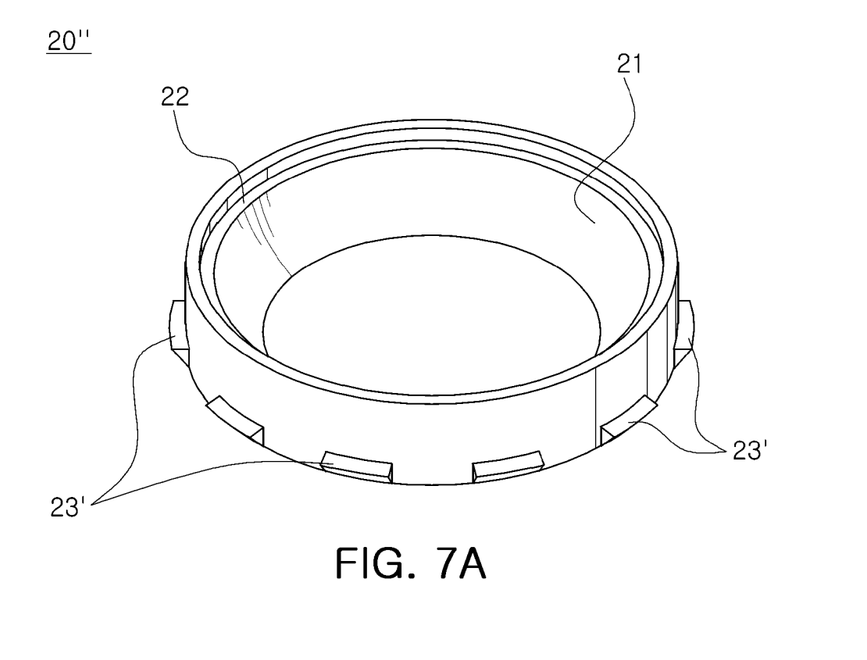
FIGS. 7A and 7B are schematic perspective views, respectively showing another embodiment of the reflecting part shown in FIG. 4 and FIGS. 5A and 5B.
Figure 7B:
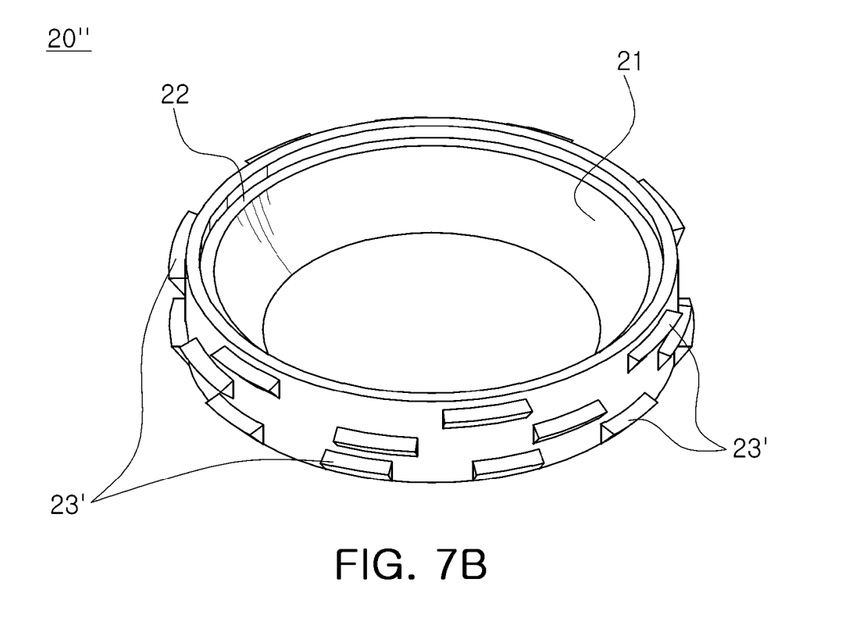
Figure 8:
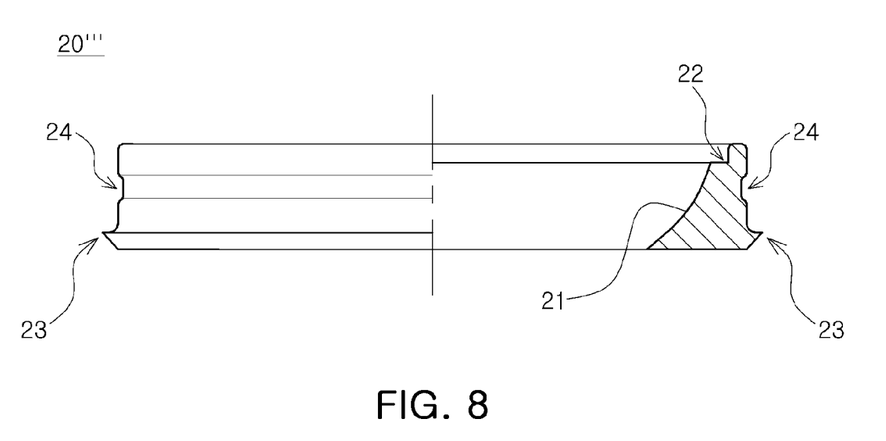
FIG. 8 is a schematic cross-sectional view showing another embodiment of the reflecting part shown in FIG. 4 and FIGS. 5A and 5B.

FIG. 4 is a schematic view of a reflecting part in the light emitting device package of FIG. 1. FIGS. 5A and 5B are schematic cross-sectional views of the reflecting part shown in FIG. 4. FIGS. 6A and 6B are schematic cross-sectional views, respectively showing another embodiment of the reflecting part shown in FIG. 4 and FIGS. 5A and 5B. FIGS. 7A and 7B are schematic perspective views, respectively showing another embodiment of the reflecting part shown in FIG. 4 and FIGS. 5A and 5B. FIG. 8 is a schematic cross-sectional view showing another embodiment of the reflecting part shown in FIG. 4 and FIGS. 5A and 5B.

As shown in FIGS. 1 through 4, the reflecting part 20 may be made of a highly reflective metallic material, such as aluminum (Al), copper (Cu), or copper coated with silver (Ag), and may have a ring-shaped structure such that the light emitting device 11 may be disposed in the center thereof. As shown in FIGS. 1 through 4, the reflecting part 20 is generally formed to have a round shape, corresponding to the shape of the cavity 13. However, the shape of the reflecting part 20 is not limited thereto and may be varied, for example, a quadrangular ring shape, a polygonal ring shape or the like.

The reflecting part 20 may have a solid structure, as shown in FIG. 5A. The reflecting part 20 may also have a hollow structure formed by extruding a metal plate through a pressing process, as shown in FIG. 5B.

The reflecting part 20 may have a reflecting surface 21 having a tapered shape in which an inner circumferential surface of the reflecting part 20 is inclined at a predetermined angle from an upper portion towards a lower portion. The angle of the inclination of the reflecting surface 21 may be altered within a wide range in consideration of the characteristics and orientation angles of the light emitting device 11, and may be selectively applied so as to allow for the exhibition of a desired optical characteristic according to a product. That is, in the case of integrally forming the reflecting part with the body part according to the related art, there are limitations in that, according to the alternation the reflecting surface, the body part may need to be re-manufactured. However, since the reflecting part according to the present invention may be separated from the body part 10, only the reflecting part may be re-manufactured and selectively according to the design of the reflecting surface 21 to thereby allow for the simplification of a manufacturing process and a reduction in costs. The surface of the reflecting surface 21 may be coated with a highly reflective material or attached to the highly reflective material in the form of a thin film.

The reflecting part 20 may include a recess part 22 having a stepped structure in a top portion thereof. The recess part 22 may be formed in a downwardly stepped manner from an upper surface of the reflecting part 20 and may have a stair structure with respect to the reflective surface 21. The recess part 22 may act as a dam supporting the sealing part 30, such that the sealing part 30, including a resin, may not overflow from the reflecting part 20.

Meanwhile, as shown in FIGS. 5A and 5B, the reflecting part 20 may include a fixing part 23 formed to be protruded from an outer circumferential surface of the reflecting part 20 and caught and fixed to the inner circumferential surface of the cavity 13. The fixing part 23 may allow the reflecting part 20 to be easily inserted in the cavity 30, and may have a snap fit shape having an inverted truncated conical structure such that the reflecting part 20 may not be easily separated from the cavity 13. Therefore, the reflecting part 20 may be easily introduced along and inserted into the inner circumferential surface of the cavity 13 through an inclined surface of the fixing part 23, while the reflecting part 20 is caught and fixed to the inner circumferential surface of the cavity 13 through a stepped edge of the fixing part 23 and may not easily escape therefrom. Although not illustrated, in corresponding to the fixing part 23, the inner circumferential surface of the cavity 13 may be provided with a groove for inserting the fixing part 23.

FIGS. 6A and 6B are schematic cross-sectional views, respectively showing another embodiment of the reflecting part shown in FIG. 4 and FIGS. 5A and 5B. The embodiment of FIG. 6 may be substantially the same as the embodiment of FIG. 4 and FIGS. 5A and 5B and be different therefrom in an aspect of the formation location of the fixing part 23. That is, as shown in FIG. 4 and FIGS. 5A and 5B, the fixing part 23 may be formed in a lower portion of the reflecting part 20. Furthermore, the fixing part 23 may also be formed in an upper portion of a reflecting part 20' as shown in FIG. 6A, and may also be formed in both upper and lower portions of the reflecting part 20' as shown in FIG. 6B.

FIGS. 7A and 7B are schematic perspective views, respectively showing another embodiment of the reflecting part shown in FIG. 4 and FIGS. 5A and 5B. The embodiments of FIGS. 7A and 7B may be substantially the same as the embodiment of FIG. 4 and FIGS. 5A and 5B and be different therefrom in view of the shape of a fixing part 23'. That is, as shown in FIG. 4 and FIGS. 5A and 5B, the fixing part 23 may have a ring shape continuously formed along the outer circumferential surface of the reflecting part 20. The fixing part 23 may be provided in plural. As shown in FIGS. 7A and 7B, the fixing part 23' may be provided in plural and the plurality of fixing parts 23' may be formed along the outer circumferential surface of a reflecting part 20" while being spaced apart from one another. In this case, the plurality of fixing parts 23' may be arranged in a line as shown in FIG. 7A and may be irregularly arranged as shown in FIG. 7B.

FIG. 8 is a schematic cross-sectional view showing another embodiment of the reflecting part shown in FIG. 4 and FIGS. 5A and 5B. The embodiment of FIG. 8 may be substantially the same as the embodiment of FIG. 4 and FIGS. 5A and 5B and be different therefrom in that a groove 24 formed to be recessed along the outer circumferential surface of a reflecting part 20'" is further included therein.

As illustrated in FIG. 8, the groove 24 may be formed continuously along the outer circumferential surface of the reflecting part 20'". FIG. 8 illustrates that the groove 24 is provided singularly and forms a single circle. However, the present invention is not limited thereto; and the groove 24 may also be provided in plural and the plurality of grooves 24 may form a plurality of circles. When a resin forming the sealing part 30 or a lens part 50, to be described later, is filled in an accommodating space 40 formed between the cavity 13 and the reflecting part 20'", the groove 24 may receive the resin therein to thereby allow for an increase in coupling force between the cavity 13 and the reflecting part 20'". Here, the accommodating space 40 will be described later.

Meanwhile, as shown in FIG. 2, the accommodating space 40 formed by the fixing part 23 may be provided between the outer circumferential surface of the reflecting part 20 and the inner circumferential surface of the cavity 13. The accommodating space 40 may be modified according to a distance for which the fixing part 23 is protruded from the outer circumferential surface of the reflecting part 20.

In forming the sealing part 30 (which will be described later) by filling a space defined by the reflecting surface 21 of the reflecting part 20 with a resin so as to seal the light emitting device 11, the accommodating space 40 may accommodate the remaining resin left after being filled inside the reflecting part 20 therein, in order to prevent the remaining resin from overflowing from the reflecting part 20 to the body part 10.

In addition, in the forming of the lens part 50 on the body part 10, the accommodating space 40 may be filled with resin forming the lens part 50 to thereby allow for an increase in coupling force between the lens part 50 and the body part 10. With regard to this, explanations will be provided later.

The sealing part 30 may be filled in an inner portion of the reflecting part 20 and seal the light emitting device 11. The sealing part 30 may be filled in the inner portion of the reflecting part 20 to be cured. The sealing part 30 may be made of a resin having high transparency, the high transparent resin being capable of transmitting light generated from the light emitting device 11 at a minimal rate of loss. The sealing part 30 may be made of an elastic resin, for example. Since the elastic resin which is a thermosetting resin in the form of gel, such as silicon or the like, may have little change caused by light of a short wavelength, such as yellowing, and may also have high refractive index, the sealing part 30 using the elastic resin may have excellent optical characteristics. In addition, the sealing part 30 using the elastic resin may more stably protect the light emitting device from stress caused by heat, vibrations, external impacts, or the like, due to the less yellowing and the higher refractive index than a thermoplastic resin. Further, since the sealing part 30 may be filled in the inner portion of the reflecting part 20, in liquid state and then cured, internal gas may be advantageously exposed and smoothly discharged to the outside during a curing process.

The resin forming the sealing part 30 may contain an ultraviolet absorber absorbing ultraviolet rays emitted from the light emitting device 11 or a fluorescent material converting monochromatic light into white light.

Figure 9A:
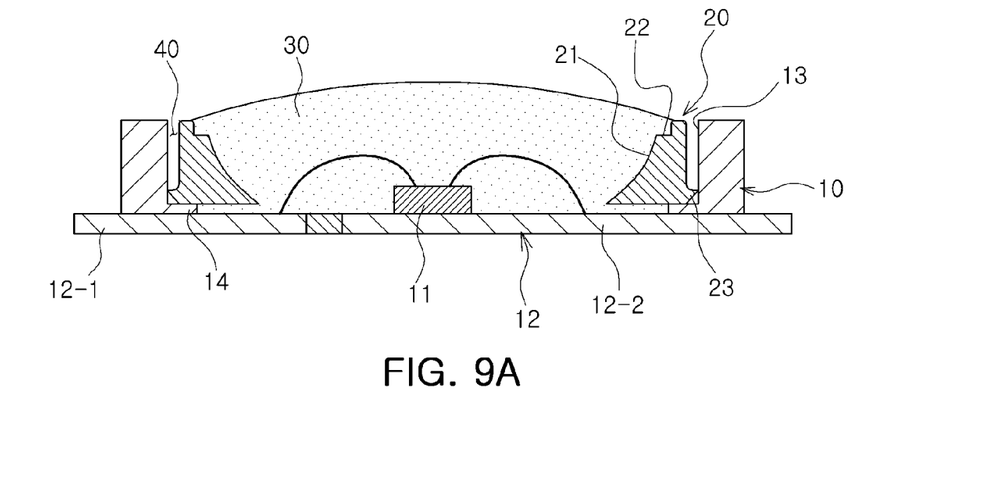
FIGS. 9A and 9B are schematic cross-sectional views respectively showing another embodiment of the sealing part in the light emitting device package of FIG. 1.

As shown in FIG. 1, the sealing part 30 may have a substantially planar upper surface formed within the reflecting part 20. As shown in FIG. 9A, the sealing part 30 may be formed to have a dome-shaped lens structure including a convex upper surface. The sealing part 30 having the lens structure may be formed in such a manner that the recess part 22 of the reflecting part 20 supports the resin forming the sealing part 30 to prevent the resin from overflowing, in order to maintain the dome shape thereof through surface tension of the resin. In this manner, in a case in which the sealing part 30 may be filled in the inner portion of the reflecting part 20, heat generated from the light emitting device 11 to be transmitted to the reflecting part 20 of a metallic material may be advantageously discharged to the outside through the accommodating space 40 formed between the reflecting part 30 and the cavity 13, whereby radiation efficiency of heat may be improved. In addition, the upper surface of the sealing part 30 may be formed to have a convex or concave lens shape, whereby the orientation angle of light emitted through the upper surface of the sealing part 30 may be adjusted.

Figure 9B:
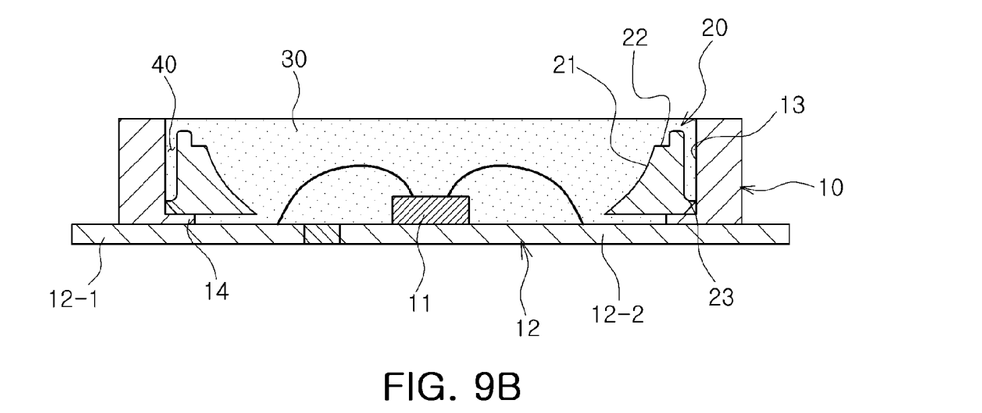

As shown in FIG. 9B, the sealing part 30 may be filled in the accommodating space 40 so as to surround the reflecting part 20. In this case, the introduction of a contaminant into the accommodating space 40 may be prevented. In addition, the sealing part 30 may be filled in the cavity 13 of the body part 10, together with the reflecting part 20, whereby coupling force between the sealing part 30 and the body part 10 may be improved to prevent the sealing part 30 from being easily separated from the body part 10. In particular, as shown in FIG. 8, in a case in which the groove 24 is formed in the outer circumferential surface of the reflecting part 20''', the groove 24 may also be filled with the sealing part 30 to allow for enhanced coupling force between the sealing part 30 and the body part 10, whereby mechanical reliability may be improved.

When the sealing part 30 is filled in the accommodating space 40 as above, in a case in which the fixing part 23 is formed to have a continuous ring shape as illustrated in FIG. 1, the accommodating space 40 may be filled with the sealing part 30 to a level equal to a height of the fixing part 23. Meanwhile, in a case in which the plurality of fixing parts 23' are formed to be spaced apart from another by a predetermined distance as illustrated in FIG. 7, the sealing part 30 may be introduced into spaced distances between the fixing parts 23' and be filled in the accommodating space 40 to a level equal to a height of the seating part 14, whereby coupling force between the sealing part 30 and the body part 10 may be enhanced.

Figure 10:
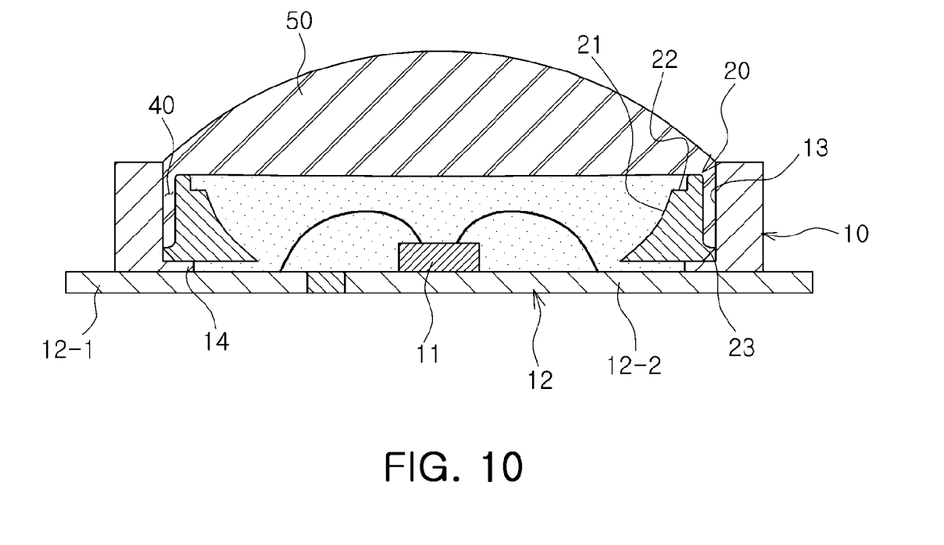
FIG. 10 is a schematic cross-sectional view showing a state in which a lens part is included in the light emitting device package of FIG. 1.

FIG. 10 is a schematic cross-sectional view showing a state in which a lens part is included in the light emitting device package of FIG. 1. As shown in FIG. 10, the lens part 50 covering the sealing part 30 may be provided on the body part 10. The lens part 50 may be formed on the sealing part 30 of the body part 10 by injection-molding transparent silicon, an epoxy resin, plastics, or the like.

The lens part 50 may be formed by curing the injected lens molding materials on the sealing part 3, and in this case, the lens molding material may be filled in the accommodating space 40 between the reflecting part 20 and the cavity 13. Accordingly, coupling force between the lens part 50 and the body part 10 may be enhanced. In particular, in a case in which the plurality of fixing parts 23' are formed to be spaced apart from another by a predetermined distance as illustrated in FIG. 7, the lens molding material may be introduced into spaced distances between the fixing parts 23' and filled in the accommodating space 40 to a level equal to the height of the seating part 14. In addition, in a case in which the groove 24 is formed in the outer circumferential surface of the reflecting part 20''' as illustrated in FIG. 8, the groove 24 may also be filled with the lens molding material to allow for enhanced coupling force, whereby mechanical reliability may be improved.

As aforementioned, the light emitting device package according to the embodiments of the present invention may have a structure in which the reflecting part of a metallic material and the body part having the light emitting device mounted thereon are provided as separate components, and the reflecting part is inserted into the cavity of the body part to be coupled thereto, whereby a reduction in luminous flux due to a deterioration phenomenon caused by heat generated from a light emitting device in a package structure according to the related art, in which the reflecting surface and the body part are integrally formed, may be solved.

As set forth above, according to embodiments of the invention, discoloration due to the deterioration phenomenon at the surface of the cavity which is the reflecting surface, caused by heat generated from the light emitting device mounted within the cavity may be effectively prevented, whereby the reduction in luminous flux may be prevented.

While the present invention has been shown and described in connection with the embodiments, it will be apparent to those skilled in the art that modifications and variations can be made without departing from the spirit and scope of the invention as defined by the appended claims.

What is claimed is:

1. A light emitting device package, comprising:
   at least one light emitting device;
   a lead frame electrically connected to the light emitting device;
   a body part supporting the light emitting device and the lead frame, the body part including a cavity opened so as to expose the light emitting device and the lead frame;
   a reflecting part fitted and fixed into the cavity of the body part so as to surround the light emitting device, the reflecting part being separate from the body part; and
   a sealing part filled in the reflecting part and sealing the light emitting device,
   wherein the reflecting part is positioned between the sealing part and the body part.

2. The light emitting device package of claim 1, wherein the body part includes a seating part formed to be protruded inwardly from an inner circumferential surface of the cavity and to partially cover the lead frame exposed through the cavity, and having the reflecting part disposed on an upper surface thereof.

3. The light emitting device package of claim 2, wherein the seating part has a ring shape formed along the inner circumferential surface of the cavity.

4. The light emitting device package of claim 2, wherein the seating part includes a plurality of seating parts, and the plurality of seating parts are formed along the inner circumferential surface of the cavity while being spaced apart from one another.

5. The light emitting device package of claim 1, wherein the reflecting part has a reflecting surface having a tapered shape in which an inner circumferential surface of the reflecting part is inclined.

6. The light emitting device package of claim 1, wherein the reflecting part includes a groove formed to be recessed along an outer circumferential surface thereof.

7. The light emitting device package of claim 1, wherein the reflecting part includes a recess part having a stepped structure in a top portion thereof.

8. The light emitting device package of claim 1, wherein the reflecting part is formed to have a circular, a quadrangular, or a polygonal ring shape.

9. The light emitting device package of claim 1, further comprising a lens part provided on the body part and covering the sealing part.

10. A light emitting device package, comprising:
at least one light emitting device;
a lead frame electrically connected to the light emitting device;
a body part supporting the light emitting device and the lead frame and including a cavity opened so as to expose the light emitting device and the lead frame;
a reflecting part fitted and fixed into the cavity so as to surround the light emitting device; and
a sealing part filled in the reflecting part and sealing the light emitting device,
wherein the reflecting part includes a fixing part formed to be protruded from an outer circumferential surface thereof and caught and fixed to an inner circumferential surface of the cavity.

11. The light emitting device package of claim 10, wherein the fixing part has a snap fit shape.

12. The light emitting device package of claim 10, wherein the fixing part is formed in at least one of upper and lower portions of the reflecting part, or formed in both of the upper and lower portions of the reflecting part.

13. The light emitting device package of claim 10, wherein the fixing part has a ring shape formed along the outer circumferential surface of the reflecting part.

14. The light emitting device package of claim 10, wherein the fixing part includes a plurality of fixing parts, and the plurality of fixing parts are formed along the outer circumferential surface of the reflecting part while being spaced apart from one another.

15. The light emitting device package of claim 10, wherein between the outer circumferential surface of the reflecting part and the inner circumferential surface of the cavity, an accommodating space formed by the fixing part is provided.

* * * * *